(12) United States Patent
Lee et al.

(10) Patent No.: US 6,994,949 B2
(45) Date of Patent: Feb. 7, 2006

(54) METHOD FOR MANUFACTURING MULTI-LEVEL INTERCONNECTIONS WITH DUAL DAMASCENE PROCESS

(75) Inventors: Sung-Kwon Lee, Kyoungki-do (KR); Sang-Ik Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/066,849

(22) Filed: Feb. 4, 2002

(65) Prior Publication Data

US 2003/0003404 A1   Jan. 2, 2003

(30) Foreign Application Priority Data

Jun. 30, 2001   (KR) ................. 2001-38772

(51) Int. Cl.
  *G03F 7/16*   (2006.01)
  *G03F 7/40*   (2006.01)
  *G01L 21/027*   (2006.01)
  *G01L 21/283*   (2006.01)
  *G01L 21/311*   (2006.01)

(52) U.S. Cl. .............. 430/312; 430/314; 430/316; 430/317; 438/584; 438/624; 438/637; 438/700

(58) Field of Classification Search .............. 430/312, 430/314, 316–317; 438/584, 622, 624, 637–638, 438/700, 702, 723–724
See application file for complete search history.

(56) References Cited

U.S. PATENT DOCUMENTS

| | | | |
|---|---|---|---|
| 6,042,999 A * | 3/2000 | Lin et al. | 430/316 |
| 6,093,632 A * | 7/2000 | Lin | 438/618 |
| 6,180,514 B1 * | 1/2001 | Yeh et al. | 438/633 |
| 6,268,283 B1 * | 7/2001 | Huang | 438/638 |
| 6,737,350 B1 * | 5/2004 | Akahori et al. | 438/634 |

* cited by examiner

*Primary Examiner*—Mark P. Huff
*Assistant Examiner*—John Ruggles
(74) *Attorney, Agent, or Firm*—Marshall, Gerstein & Borun LLP

(57) ABSTRACT

A dual damascene process is disclosed which reduces capacitance increases caused by excess and unnecessary remnants of an etching stop layer and which also improves multi-level interconnect structures by removing the etching stop layer except for a portion that surrounds the via hole. This reduces or eliminates capacitance increase and avoids erosion of underlying interlayer insulating layers during formation of an upper, wider trench.

13 Claims, 9 Drawing Sheets

METHOD FOR MANUFACTURING MULTI-LEVEL INTERCONNECTIONS WITH DUAL DAMASCENE PROCESS

BACKGROUND

1. Technical Field

A method for manufacturing a semiconductor device is disclosed which includes forming multi-level interconnection lines with a dual damascene process.

2. Description of the Related Art

Recently, with increased integration of semiconductor devices, limited results have been achieved in connection with decreasing line widths using photolithography processes. To solve the above-mentioned problem, a damascene process has been used.

Generally, a trench is formed by etching an insulating layer, and a an interconnection line is formed in the trench by a self-aligned dual damascene process.

In the self-aligned dual damascene process, a via connecting the lower and upper interconnection lines is aligned at a bottom of the trench. That is, in the self-aligned dual damascene process, an insulating layer is selectively etched with a photolithography process to form a trench exposing a via at the bottom thereof, and a conductive layer is formed with W, Al or Cu to fill the trench. After that, a portion of the conductive layer outside of the trench, which is not needed, is removed by an etching or a chemical mechanical polishing (CMP) to form an interconnection line in the trench.

The above-mentioned self-aligned dual damascene process is mainly used for forming a bit line, a word line and a metal interconnection line of a dynamic random access memory (DRAM). Specifically, by using a self-aligned dual damascene process for forming a trench, a via hole that is used to form a via connecting upper and lower interconnection lines, may be formed simultaneously. By using the self-aligned dual damascene process, a height difference due to the interconnection lines is not generated, since the via and interconnection lines are buried in the interlayer insulating layers.

FIGS. 1A to 1D are cross-sectional views illustrating a conventional method for forming a multi-level metal interconnection line according to a conventional self-align dual damascene process.

Referring to FIG. 1A, interlayer insulating layers 12 and 13 and an etching stop layer 14 are formed on a semiconductor substrate 11. After that, the etching stop layer 14 and the interlayer insulating layer 13 are selectively etched to expose an area where a first metal interconnection line is to be formed.

Subsequently, a metal layer is deposited on the exposed area and selectively removed to form a metal interconnection line 15 in the etching stop layer 14 and the interlayer insulating layer 13.

Referring to FIG. 1B, a third interlayer insulating layer 16 is formed on the etching stop layer 14 and the metal interconnection line 15. An etching stop layer 17 and a fourth interlayer insulating layer 18 are successively formed on the third interlayer insulating layer 16, and a photoresist layer (not shown) is formed on the fourth interlayer insulating layer 18, then a via hole mask (not shown) is formed by exposing and developing the photoresist layer.

Subsequently, the fourth interlayer insulating layer 18, the etching stop layer 17 and the third insulating layer 16 are etched using the via hole mask to form a via hole 19, which exposes a predetermined surface of the metal interconnection line 15.

Then, after removing the via hole mask, a photoresist layer is formed on the fourth interlayer insulating layer 18 in which the via hole 19 is formed and a trench mask 20, exposing a larger area than the via hole 19, is formed by exposing and developing the photoresist layer.

Referring to FIG. 1C, a trench 21 is formed by etching the fourth interlayer insulating layer 18 using the trench mask 20. When the trench 21 is formed, the etching is stopped by the etching stop layer 17.

Referring to FIG. 1D, after removing the trench mask 20, a metal layer is deposited on the resulting structure, then an etch back or a chemical mechanical polishing (CMP) is carried out until the surface of the fourth interlayer insulating layer 18 is exposed, and thereby to form a metal interconnection line 22 in the trench 20. When the metal interconnection line 22 is formed, a via 22a connected to the metal interconnection line 15 is formed in the via hole.

As shown in FIG. 2A, after forming the trench by etching the fourth interlayer insulating layer 18, the etching stop layer 17 remains intact except at the via hole region. The etching stop layer 17 is usually formed with a nitride layer having a high capacitance value, which in this case, results in a problem of a capacitance increase due to the remaining etching stop layer 17.

Also, as shown in FIG. 2B, when the thicknesses of insulating layers are increased, the etch profile on the corner (A) of the trench may be distorted due to the low etch selectivity between the insulating layers formed with the oxide layers and the etching stop layer formed with the nitride layer.

SUMMARY OF THE DISCLOSURE

A method for forming multi-level interconnection lines using a dual damascene process is disclosed. With the dual damascene process, it is easy to control distortion of a profile of a corner of a trench, and to prevent the capacitance value from increasing due to a remaining portion of the etching stop layer.

A disclosed method for manufacturing multi-level interconnection lines of a semiconductor device comprises: forming a first interconnection line on a semiconductor substrate; forming a first interlayer insulating layer on the first interconnection line; forming a first etching stop layer on the first interlayer insulating layer; forming a via hole exposing the first interconnection line by selectively etching the first etching stop layer and the first interlayer insulating layer; forming etching stop patterns around an inlet of the via hole by selectively etching the first etching stop layer; forming a second interlayer insulating layer on the etching stop pattern and the first interlayer insulating layer; forming a trench by selectively etching the second interlayer insulating layer; and forming a conductive layer in the trench and in the via hole.

BRIEF DESCRIPTION OF THE DRAWINGS

Other aspects of the disclosed methods will become apparent from the following description with reference to the accompanying drawings, wherein.

DETAILED DESCRIPTION OF THE PRESENTLY PREFERRED EMBODIMENTS

A method of manufacturing multi-level interconnects using a dual damascene process will be described in detail referring to the accompanying drawings.

FIGS. 3A to 3E are cross-sectional views illustrating a method of manufacturing metal interconnection lines using a dual damascene process.

Figure 3A:
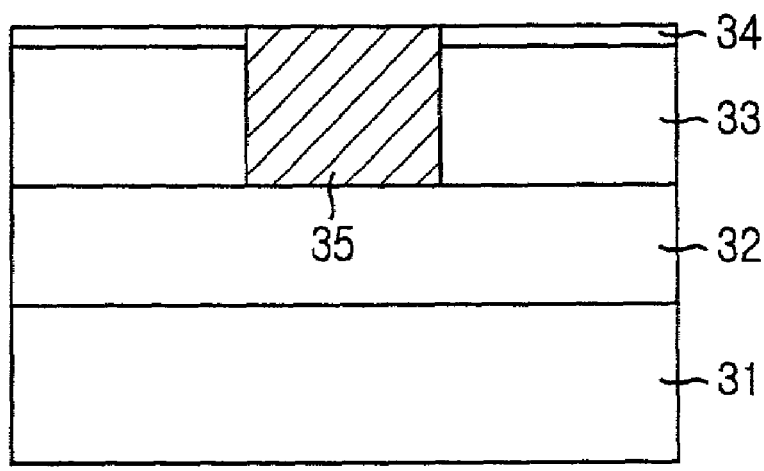
FIGS. 3A to 3E are cross-sectional views illustrating a method of manufacturing metal interconnection lines using a dual damascene process in accordance with the disclosure.

Referring to FIG. 3A, in a method of manufacturing multi-level metal interconnection lines, interlayer insulating layers 32 and 33 and an etching stop layer 34 are formed on a semiconductor substrate 31. After that, the etching stop layer 34 and the interlayer insulating layer 33 are selectively etched to form a via or a trench where a metal interconnection line 35 is then formed.

Subsequently, a metal layer is deposited on the resultant structure and is then selectively removed to form a metal interconnection line 35 that extends through the etching stop layer 34 and the interlayer insulating layer 33 as shown in FIG. 3A.

Figure 3B:
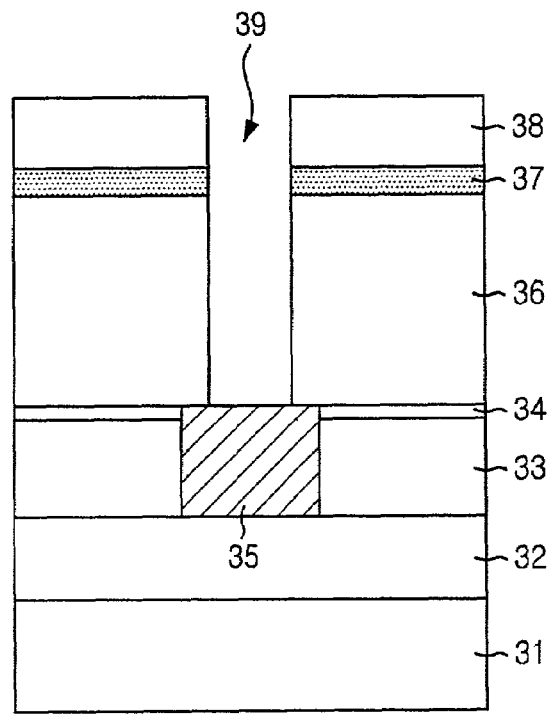

Referring to FIG. 3B, a third interlayer insulating layer 36 is formed on the etching stop layer 34 and the metal interconnection line 35. An etching stop layer 37 is formed on the third interlayer insulating layer 36. Thereafter, a photoresist layer is coated on the etching stop layer 37 and exposed and developed to form a via hole mask 38.

The etching stop layers 34 and 37 are formed with any one selected from the group consisting of a nitride layer formed by a plasma enhanced chemical vapor deposition (hereinafter referred as PECVD), a SiON layer, a $Ta_2O_5$ layer, a $ZnO_2$ layer, a $ZrO_2$ layer, a ZnO layer, a HfO layer and an $Al_2O_3$ layer, at a thickness ranging from about 200 Å to about 3000 Å. Also, the interlayer insulating layers 32, 33 and 36 are formed with any one selected from the group consisting of a spin on glass (SOG) layer, an oxide layer formed with the PECVD method, a tetra ethyl ortho silicate (TEOS) layer, an oxide layer formed with high density plasma (hereinafter referred as HDP), and other insulating layers having a low dielectric constant, at a thickness ranging from about 3000 Å to about 30000 Å.

Next, the etching stop layer 37 and the third interlayer insulating layer 36 are etched using the via hole mask 38 to form a via hole 39, which exposes a predetermined portion of the metal interconnection line 35.

Figure 3C:
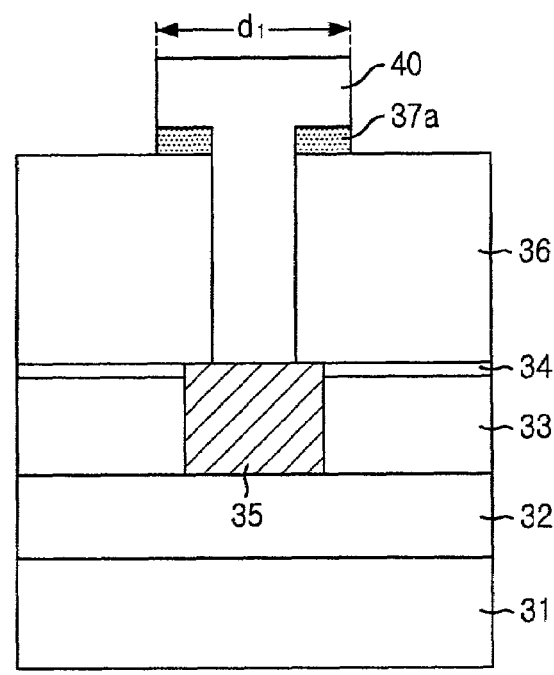

Referring to FIG. 3C, after removing the via hole mask 38, another photoresist layer is coated on a resulting structure and is exposed and developed to form a photoresist pattern 40 covering the etching stop layer 37a that surrounds the via hole 39 (see FIG. 3B). The width $d_1$ of the photoresist pattern 40 is larger than that of a trench to be formed later, by as much as 0.2 μm to 1.0 μm, which is a minimum size needed for a subsequent etching process for forming an upper trench as shown in FIGS. 3D and 3E.

Returning to FIG. 3C, the etching stop layer 37 is etched using the photoresist pattern as an etch mask to form an etching stop pattern 37a around the via hole. That is, only the etching stop pattern 37a is left intact where it can be used to form an upper trench as explained later in connection with FIGS. 3D and 3E. Therefore, even if the etching stop pattern 37a is formed with a layer having high dielectric constant, such as a nitride layer, the capacitance increase due to the relatively small portion of the etching stop pattern 37a that remains is reduced.

Figure 3D:
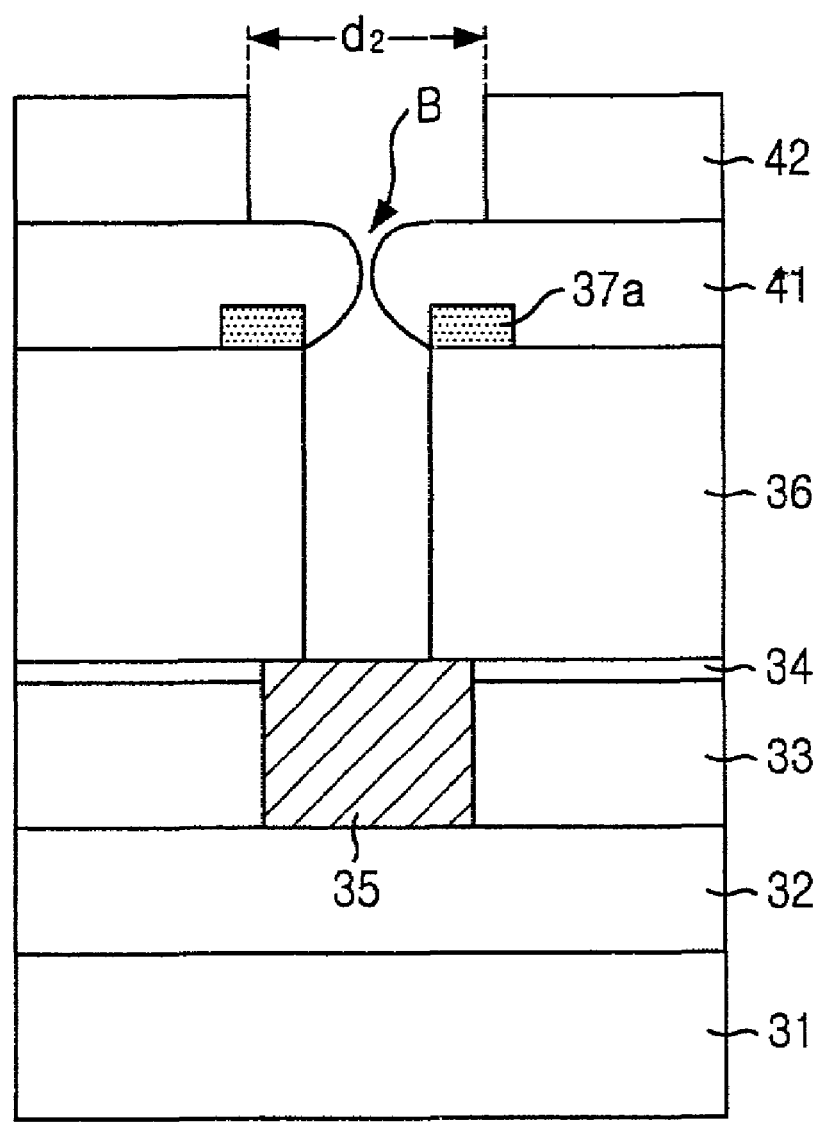
Figure 3E:
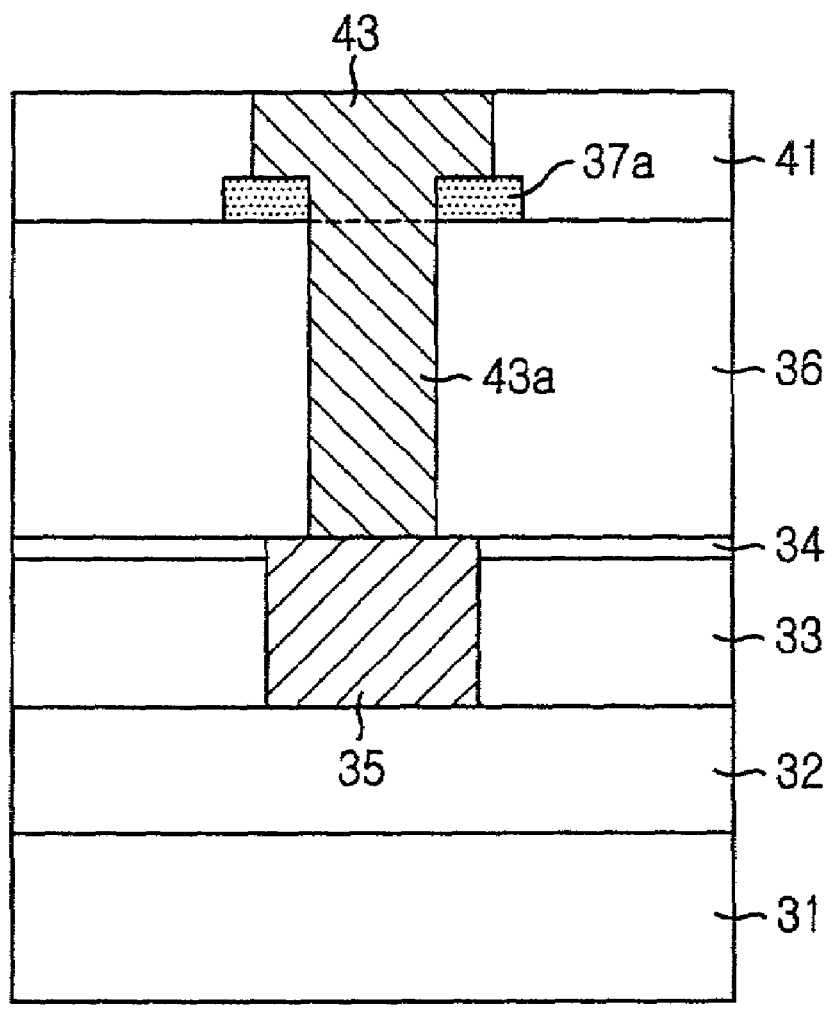

Referring to FIG. 3D, the etching stop pattern 37a is exposed by removing the photoresist pattern 40, and a fourth interlayer insulating layer 41 is formed on a resulting structure.

The fourth interlayer insulating layer 41 is formed with any one selected from the group consisting of a HDP-USG layer, an undoped silicate layer deposited by the HDP, and an oxide layer deposited by the PECVD method or low pressure chemical vapor deposition method(LPCVD), and the fourth interlayer insulating layer 41 is formed with a thickness ranging from about 2000 Å to about 30000 Å, in order to form a void (B) in the fourth interlayer insulating layer 41 as shown in FIG. 3D.

After forming the fourth interlayer insulating layer 41, a photoresist layer is coated on the fourth interlayer insulating layer 41, and a trench mask 42 is formed by exposing and developing the photoresist layer. At this time, the width $d_2$ of the trench defined by the trench mask 42 is narrower than the width $d_1$ of the photoresist pattern 40 (see FIG. 3C) to form the etching stop pattern 37a.

Referring to FIGS. 3D and 3E, a trench is formed by etching the fourth interlayer insulating layer 41 using the trench mask 42 as an etch mask. At this time, the etching is stopped at the etching stop layer patterns 37a. The etching target may be decreased as much as the size of the void (B) generated during the formation of the fourth insulating layer 41.

After removing the trench mask 42, a metal layer is deposited on the resulting structure, and an etch back or a chemical mechanical polishing (CMP) is performed until the surface of the fourth interlayer insulating layer 41 is exposed to form a metal interconnection line 43 in the trench, and at the same time a via 43a, connecting the metal interconnection line 43 to the metal interconnection line 35, is formed in the via hole 39.

The metal interconnection lines 35 and 43 and the via 43a may be formed with any one selected from the group consisting of Al, Cu, Au, Ag and Cr. The metal layers are deposited at a thickness ranging from about 2000 Å to about 30000 Å by using any one selected the group consisting of a chemical vapor deposition (CVD) an electroless deposition and a physical vapor deposition (PVD).

Meanwhile, before forming the metal interconnection line 43, a diffusion barrier layer may be formed at a thickness ranging from about 1000 Å to about 5000 Å. The diffusion barrier layer is formed with any one selected from the group consisting of a TiN layer, a Ti layer, a W layer, a WN layer and a TiW layer.

In the above-mentioned embodiments the disclosed method is for forming a multi-layer metal interconnection line. However, the disclosed method may be adapted in a method for forming a word line, a bit line and a contact, which have a dual damascene structure.

Figure 1A:
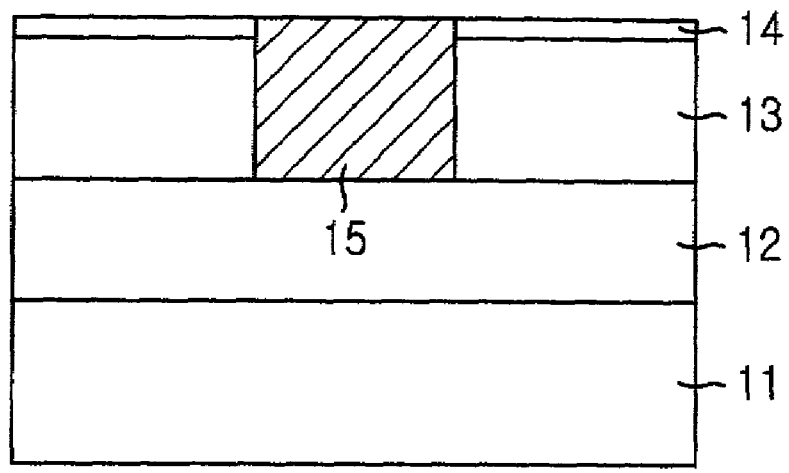
FIGS. 1A to 1D are cross-sectional views illustrating a conventional method of manufacturing metal interconnection lines using a dual damascene process.
Figure 1B:
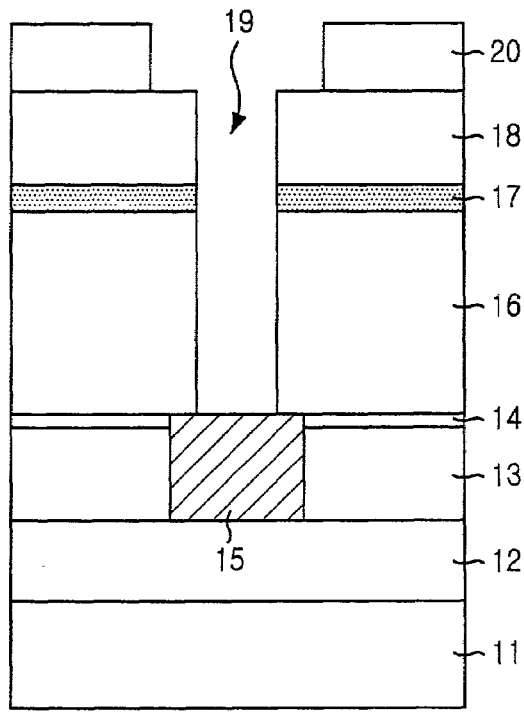
Figure 1C:
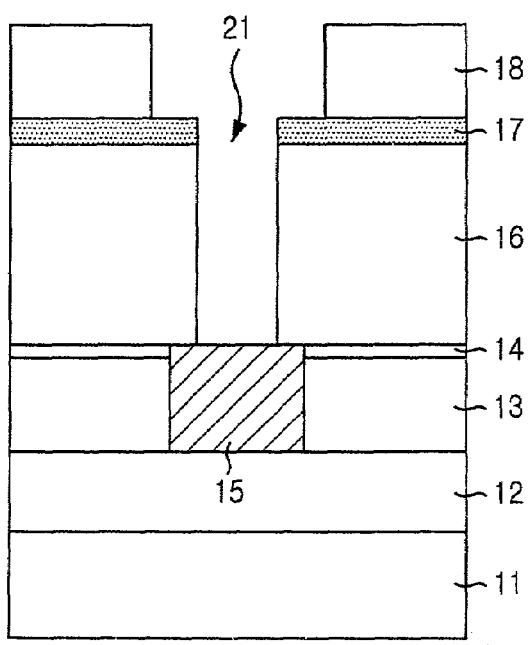
Figure 1D:
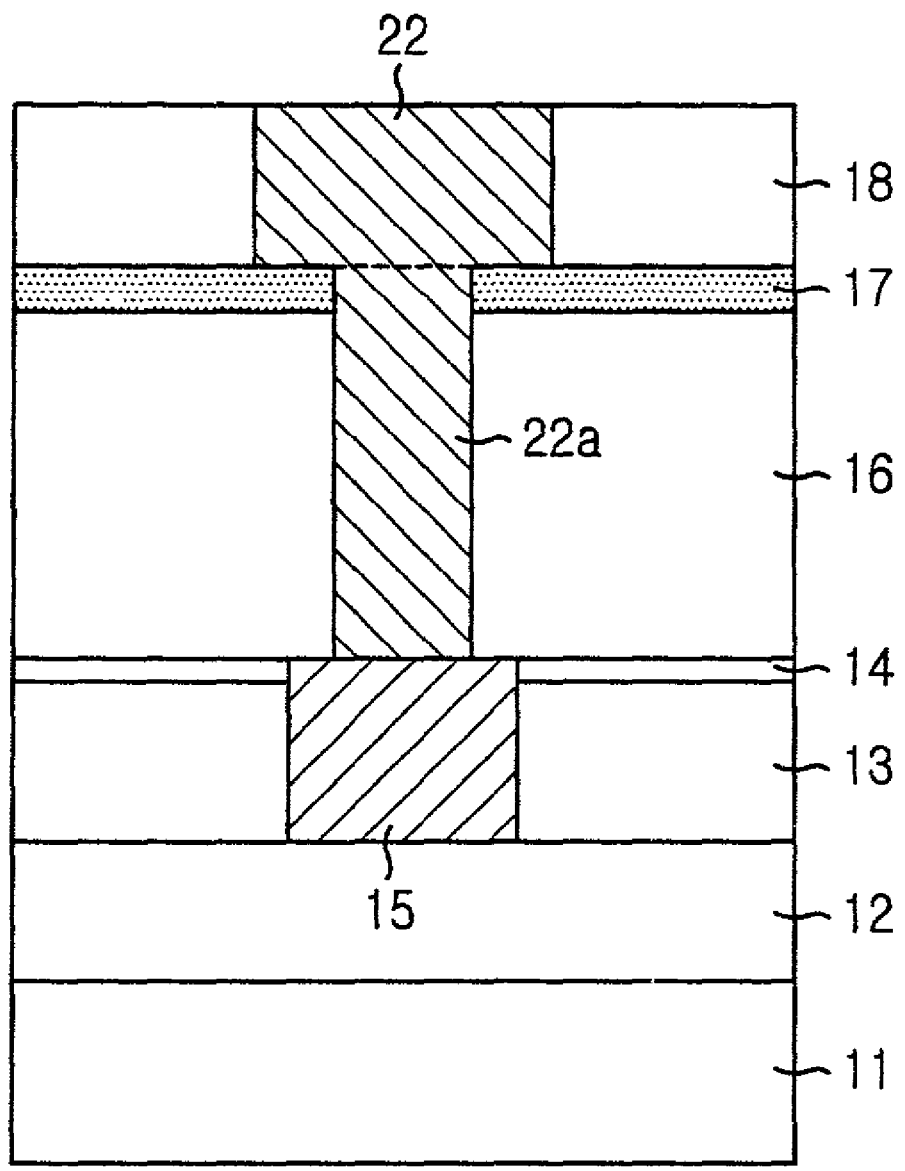
Figure 2A:
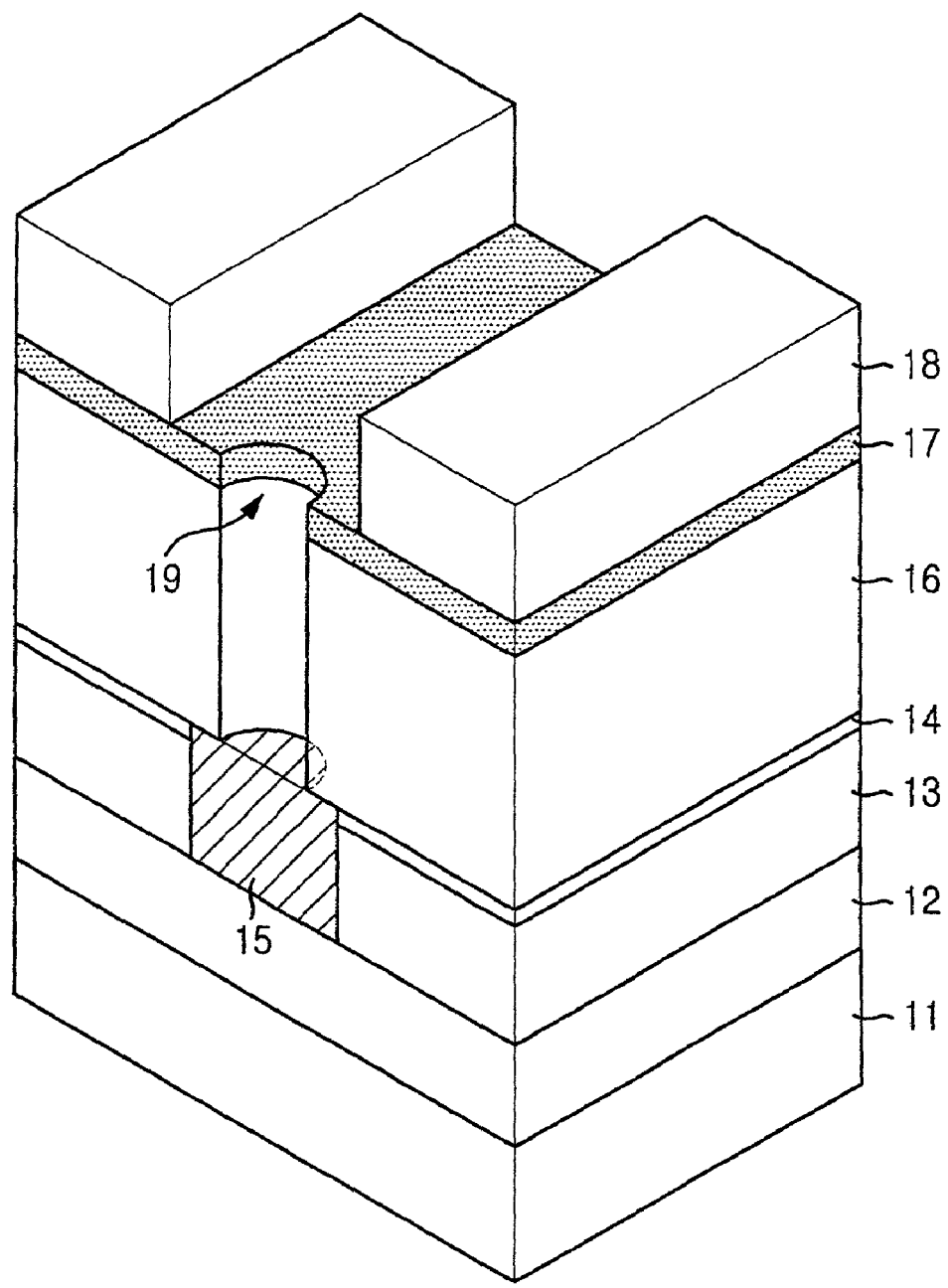
FIG. 2A is a perspective view illustrating a remaining etching stop layer after etching a trench in accordance with the conventional method.
Figure 2B:
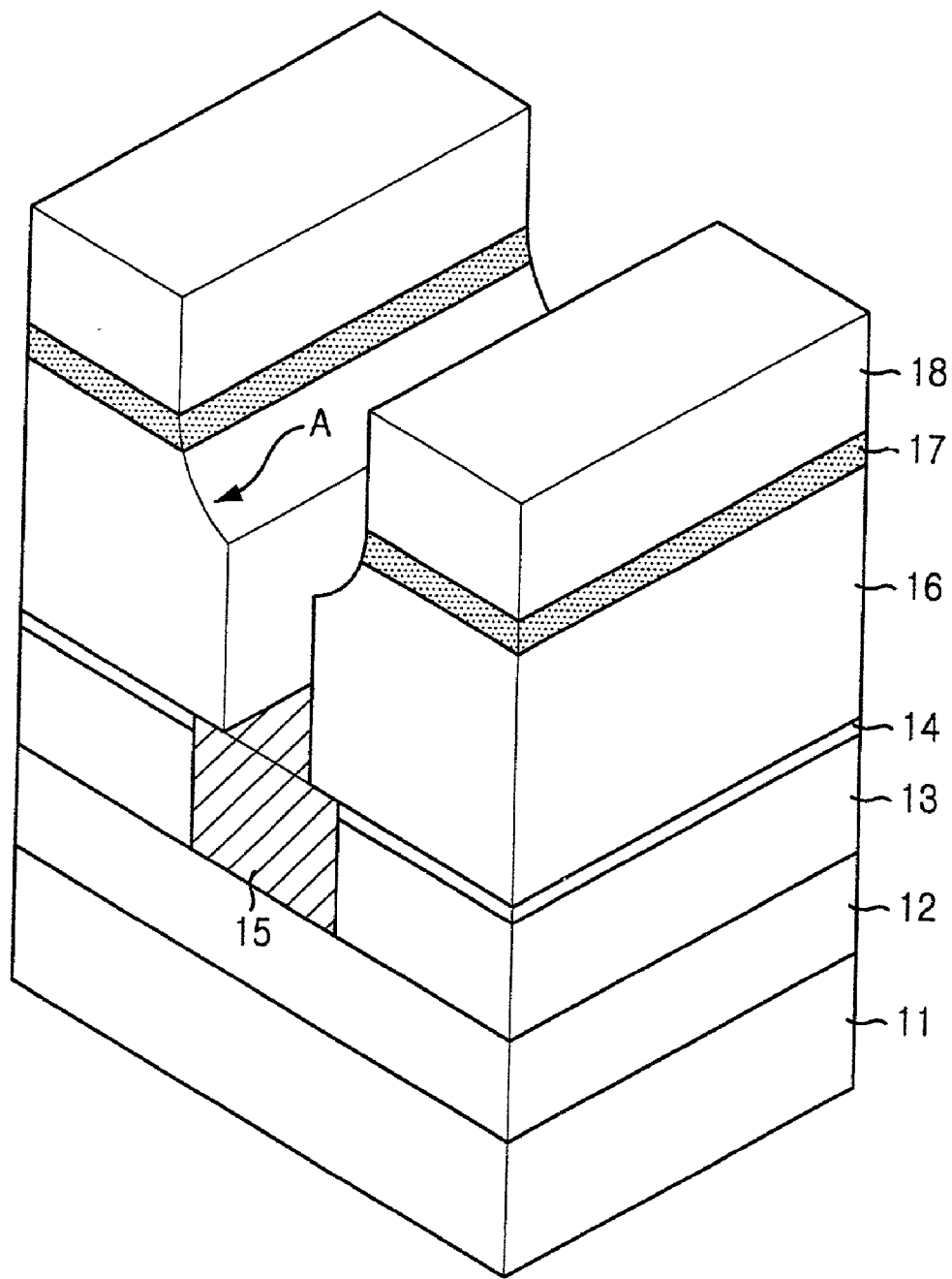
FIG. 2B is a perspective view illustrating a profile distortion at a corner of a trench formed in accordance with the conventional method.

Since the remaining portion of the etching stop layer 37a that surrounds the via hole 39 (see FIGS. 3B–3E) is formed by patterning the etching stop layer 37 (FIGS. 3B and 3C) so that the layer 37 remains only around the inlet of the via hole 39 (FIGS. 3B and 3C), an increase in capacitance due to a larger remaining etching stop layer having high capacitance as shown in FIGS. 2A–2B can be prevented. Also, since the interlayer insulating layer 41 having a void is etched to form the trench (FIGS. 3D–3E), the margin of the trench etching process may be maximized so that the etched profile of the resulting structure shown in FIG. 3E is improved over that of the prior art structure shown in FIG. 2B.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing multi-level interconnection lines of a semiconductor device comprising:
    forming a first interconnection line in a second interlayer insulating layer and a first etching stop layer sequentially formed on a first interlayer insulating layer disposed on a semiconductor substrate;
    forming a third interlayer insulating layer on the first interconnection line and the first etching stop layer;
    forming a second etching stop layer on the third interlayer insulating layer;
    forming a via hole exposing the first interconnection line by selectively etching the second etching stop layer and the third interlayer insulating layer;
    forming an etching stop pattern around an inlet of the via hole by selectively etching the second etching stop layer leaving a portion of the second etching stop layer around the inlet of the via hole and exposing a portion of the third interlayer insulating layer;
    forming a fourth interlayer insulating layer on the portion of the second etching stop layer disposed around the inlet of the via hole and the exposed portion of the third interlayer insulating layer and partially covering the via hole;
    forming a trench by selectively etching the fourth interlayer insulating layer to expose the portion of the second etching stop layer disposed around the via hole; and
    forming a conductive layer in the trench and in the via hole so that the conductive layer at least partially covers the portion of the second etching stop layer disposed around the inlet of the via hole.

2. The method of claim 1, wherein the method further comprises:
    forming a photoresist pattern around the inlet of the via hole to cover the portion of the second etching stop layer disposed around the inlet of the via hole; and
    removing other portions of the second etching stop layer which are not covered with the photoresist pattern to expose the portion of the third interlayer insulating layer.

3. The method of claim 1, wherein the trench exposes part of the portion of the second etching stop layer disposed around the via hole.

4. The method of claim 1, wherein the width of the trench is wider than that of the via hole.

5. The method of claim 1, wherein a void is formed in the fourth interlayer insulating layer during the step of forming the fourth interlayer insulating layer.

6. The method of claim 5, wherein the fourth interlayer insulating layer is formed with any one selected from the group consisting of an USG layer deposited by a high density plasma and an oxide deposited by either plasma enhanced chemical vapor deposition or low pressure chemical vapor deposition.

7. The method of claim 5, wherein the fourth interlayer insulating layer is formed at a thickness ranging from about 2000 Å to about 30000 Å.

8. The method of claim 1, wherein the first to third interlayer insulating layers are formed with any one selected from the group consisting of a spin on glass layer, an oxide layer deposited by a plasma enhanced chemical vapor deposition method, an oxide layer deposited by a high density plasma method and a tetra-ethyl-ortho-silicate(TEOS) layer.

9. The method of claim 8, wherein the first to third interlayer insulating layers are formed at a thickness ranging from about 3000 Å to about 30000 Å.

10. The method of claim 1, wherein the second etching stop layer is formed with any one selected from the group consisted of a nitride layer deposited by a plasma enhanced chemical vapor deposition method, a SiON layer a $Ta_2O_5$ layer, a $ZnO_2$ layer, a $ZrO_2$ layer, a ZnO layer, a HfO layer and an $Al_2O_3$ layer.

11. The method of claim 10, wherein the second etching stop layer is formed at a thickness ranging from about 200 Å to about 3000 Å.

12. The method of claim 1, wherein the first interconnection line is formed of any one selected form a group consisting of Al, Cu, Au, Ag and Cr.

13. The method of claim 1, the first interconnection line is formed at a thickness ranging from about 2000 Å to about 30000 Å.

* * * * *